(12) United States Patent
Lim et al.

(10) Patent No.: US 8,455,345 B2
(45) Date of Patent: Jun. 4, 2013

(54) METHODS OF FORMING GATE STRUCTURE AND METHODS OF MANUFACTURING SEMICONDUCTOR DEVICE INCLUDING THE SAME

(75) Inventors: Ha-Jin Lim, Seoul (KR); Moon-Han Park, Yongin-si (KR); Min-Woo Song, Seongnam-si (KR); Jin-Ho Do, Hwaseong-si (KR); Weon-Hong Kim, Suwon-si (KR); Moon-Kyun Song, Anyang-si (KR); Dae-Kwon Joo, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 88 days.

(21) Appl. No.: 13/228,089

(22) Filed: Sep. 8, 2011

(65) Prior Publication Data

US 2012/0070975 A1    Mar. 22, 2012

(30) Foreign Application Priority Data

Sep. 20, 2010    (KR) .................. 10-2010-0092394

(51) Int. Cl.
    *H01L 21/28* (2006.01)
(52) U.S. Cl.
    USPC ........... 438/592; 438/197; 438/198; 438/216; 438/585; 438/591; 257/E21.19

(58) Field of Classification Search
    USPC .................... 438/591, 592; 257/E21.19
    See application file for complete search history.

(56) References Cited

U.S. PATENT DOCUMENTS

| | | | |
|---|---|---|---|
| 6,518,106 B2 | 2/2003 | Ngai et al. | |
| 2004/0023476 A1* | 2/2004 | Ballantine et al. | 438/585 |
| 2008/0122007 A1* | 5/2008 | Kawai et al. | 257/374 |
| 2010/0072535 A1* | 3/2010 | Takashima et al. | 257/324 |
| 2012/0161250 A1* | 6/2012 | Kronholz et al. | 257/407 |

FOREIGN PATENT DOCUMENTS

| | | |
|---|---|---|
| KR | 1020000037911 A | 7/2000 |
| KR | 1020010061783 A | 7/2001 |

* cited by examiner

*Primary Examiner* — Angel Roman
(74) *Attorney, Agent, or Firm* — Myers Bigel Sibley & Sajovec, P.A.

(57) ABSTRACT

A method of forming agate structure having an improved electric characteristic is disclosed. A gate insulating layer is formed on a substrate and a metal layer is formed on the gate insulating layer. Then, an amorphous silicon layer is formed on the metal layer by a physical vapor deposition (PVD) process. An impurity doped polysilicon layer is formed on the amorphous silicon layer. Formation of an oxide layer at an interface between the amorphous silicon layer and the metal layer may be prevented.

20 Claims, 12 Drawing Sheets

⊗ → FIRST DIRECTION
  SECOND DIRECTION

METHODS OF FORMING GATE STRUCTURE AND METHODS OF MANUFACTURING SEMICONDUCTOR DEVICE INCLUDING THE SAME

CROSS REFERENCE TO RELATED APPLICATIONS

This application claims priority under 35 USC §119 to Korean Patent Application No. 10-2010-0092394, filed on Sep. 20, 2010 in the Korean Intellectual Property Office (KIPO), the disclosure of which is incorporated herein by reference in its entirety.

BACKGROUND OF THE INVENTION

1. Field

Embodiments of the inventive concept relate to methods of forming a gate structure and methods of manufacturing a semiconductor device including the same. More particularly, embodiments of the inventive concept relate to methods of forming a gate structure including a metal and methods of manufacturing a semiconductor device including the same.

2. Description of the Related Art

To decrease a leakage current through a gate insulating layer of a transistor, a method of forming the gate insulating layer using a material having a high dielectricity has been developed. When a gate electrode including polysilicon is formed on the high dielectric layer, some problems may be encountered including an increase of a threshold voltage of the transistor by a Fermi pinning phenomenon, a decrease of electron mobility, a decrease of a flat band, etc.

Accordingly, a method of forming a gate structure formed by integrating a metal layer and a polysilicon layer on the high dielectric layer one by one may be applied. However, when the polysilicon layer is formed on the metal layer, an oxide layer may be formed at an interface of the polysilicon layer and the metal layer to deteriorate characteristics of the gate structure. Accordingly, a method of forming a gate structure having a good electric property may be desired.

SUMMARY

Some embodiments provide methods of forming a gate structure having good electrical characteristics.

Some embodiments provide methods of manufacturing a semiconductor device including a gate structure having good electrical characteristics.

According to some embodiments, in methods of forming a gate structure, a gate insulating layer is formed on a substrate and a metal layer is formed on the gate insulating layer. Then, an amorphous silicon layer is formed on the metal layer by a physical vapor deposition (PVD) process. An impurity doped polysilicon layer is formed on the amorphous silicon layer.

In some embodiments, the PVD process may be performed under a pressure lower than $10^{-5}$ torr.

In some embodiments, the method may further include performing an annealing process with respect to the gate structure after forming the impurity doped polysilicon layer.

In some embodiments, the annealing process may be performed at a temperature range from about 750° C. to about 1,150° C.

In some embodiments, the amorphous silicon layer may be transformed into a crystalline silicon layer through the annealing process.

In some embodiments, the impurity doped polysilicon layer may be formed by forming a polysilicon layer on the amorphous silicon layer through a chemical vapor deposition (CVD) process or an atomic layer deposition (ALD) process and then, doping impurities into the polysilicon layer using an ion implantation process.

In some embodiments, the gate insulating layer may be formed by forming a low dielectric layer on the substrate and then forming a high dielectric layer on the low dielectric layer.

In some embodiments, the high dielectric layer may be formed by using at least one oxide selected from the group consisting of hafnium oxide, zirconium oxide, tantalum oxide, aluminum oxide, lanthanum oxide, hafnium silicon oxide, zirconium silicon oxide and tantalum silicon oxide.

In some embodiments, the metal layer may be formed by using at least one compound selected from the group consisting of molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride and titanium aluminum nitride.

In some embodiments, a thickness of the impurity doped polysilicon layer may be from about 50% to about 90% of a total thickness of the amorphous silicon layer and the impurity doped polysilicon layer.

According to some embodiments, in methods of manufacturing a semiconductor device, a gate insulating layer is formed on a substrate and a metal layer is formed on the gate insulating layer. Then, an amorphous silicon layer is formed on the metal layer through a physical vapor deposition (PVD) process. An impurity doped polysilicon layer is formed on the amorphous silicon layer. The semiconductor device is annealed to activate impurities included in the impurity doped polysilicon layer and to crystallize the amorphous silicon layer to form a crystalline silicon layer. The impurity doped polysilicon layer, the crystalline silicon layer, the metal layer and the gate insulating layer are patterned one by one to form a gate structure including a gate insulating layer pattern, a metal layer pattern, a crystalline silicon layer pattern and an impurity doped polysilicon layer pattern.

In some embodiments, the PVD process may be performed under a pressure lower than $10^{-5}$ torr.

In some embodiments, the impurity doped polysilicon layer may be formed by forming a polysilicon layer on the amorphous silicon layer through a chemical vapor deposition (CVD) process or an atomic layer deposition (ALD) process and then, doping impurities into the polysilicon layer through executing an ion implantation process.

In some embodiments, the gate insulating layer may be formed by forming a low dielectric layer on the substrate and then forming a high dielectric layer on the low dielectric layer.

In some embodiments, the high dielectric layer may be formed by using at least one oxide selected from the group consisting of hafnium oxide, zirconium oxide, tantalum oxide, aluminum oxide, lanthanum oxide, hafnium silicon oxide, zirconium silicon oxide and tantalum silicon oxide.

In some embodiments, the metal layer may be formed by using at least one compound selected from the group consisting of molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride and titanium aluminum nitride.

In some embodiments, a thickness of the impurity doped polysilicon layer may be from about 50% to about 90% of a total thickness of the amorphous silicon layer and the impurity doped polysilicon layer.

As explained above, according to some embodiments, an amorphous silicon layer may be formed using a low pressure physical vapor deposition process on a metal layer formed on a gate insulating layer. Accordingly, a formation of an oxide layer at an interface between the metal layer and the amorphous silicon layer may be prevented. In addition, a polysilicon layer having a thickness larger than the amorphous silicon layer may be formed to effectively dope impurities and diffuse the doped impurities into the polysilicon layer with a low energy level at a low temperature.

BRIEF DESCRIPTION OF THE DRAWINGS

Example embodiments will be more clearly understood from the following detailed description taken in conjunction with the accompanying drawings.

FIG. 1 is a cross-sectional view that illustrates a gate structure in accordance with some example embodiments.

FIGS. 2 to 6 are cross-sectional views that illustrate a method of forming a gate structure in accordance with some example embodiments.

FIGS. 7 to 11 are cross-sectional views that illustrate a method of manufacturing a semiconductor device including a gate structure in accordance with some example embodiments.

FIGS. 12 to 14 are cross-sectional views that illustrate a method of forming a gate structure in accordance with some other example embodiments.

FIGS. 15 to 18 are cross-sectional views that illustrate a method of manufacturing a semiconductor device including a gate structure in accordance with some other example embodiments.

DETAILED DESCRIPTION

Figure 1:
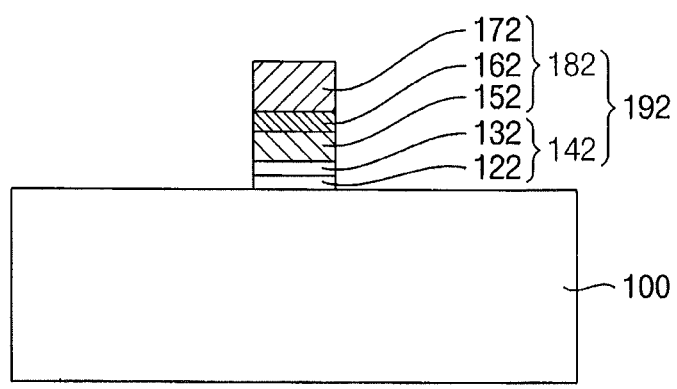
FIGS. 1 to 18 represent example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout the description. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, example embodiments of methods of forming a gate structure will be explained in detail.

FIG. 1 is a cross-sectional view for explaining a gate structure in accordance with some example embodiments.

Referring to FIG. 1, a gate structure 192 may include a gate insulating layer pattern 142 and a gate electrode 182 integrated one by one on a substrate 100. The gate insulating layer pattern 142 may include a low dielectric layer pattern 122 and a high dielectric layer pattern 132 integrated one by one on the substrate 100. The gate electrode 182 may include a metal layer pattern 152, a crystalline silicon layer pattern 162, and an impurity doped polysilicon layer pattern 172 integrated one by one on the gate insulating layer pattern 142.

The low dielectric layer pattern 122 may include a material having a low dielectricity, such as silicon oxide and silicon oxynitride. The high dielectric layer pattern 132 may include a material having a high dielectricity, such as a metal oxide, a metal oxynitride, etc. Examples of the material having a high dielectricity may include hafnium oxide, hafnium silicon oxide, zirconium oxide, zirconium silicon oxide, hafnium oxynitride, hafnium silicon oxynitride, zirconium oxynitride, zirconium silicon oxynitride, aluminum oxide, hafnium aluminum oxide, lanthanum oxide, hafnium lanthanum oxide, zirconium aluminum oxide, aluminum oxynitride, hafnium aluminum oxynitride, lanthanum oxynitride, hafnium lanthanum oxynitride, zirconium aluminum oxynitride, etc. These compounds may be used alone or in combination.

The metal layer pattern 152 may include a metal, a metal nitride, a metal silicide, etc. Examples that may be used for the metal layer pattern 152 may include molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride, titanium aluminum nitride, etc.

The crystalline silicon layer pattern 162 may be formed by forming an amorphous silicon layer pattern by means of a physical vapor deposition (PVD) process, such as a sputtering process, and then, annealing the formed amorphous silicon layer pattern. In example embodiments, the crystalline silicon layer pattern 162 may include a grain having a size larger than that included in the impurity doped polysilicon layer pattern 172. Further, a formation of an oxide layer may be prevented at an interface between the metal layer pattern 152 and the crystalline silicon layer pattern 162.

The impurity doped polysilicon layer pattern 172 may include an n-type impurity such as phosphor (P) or a p-type impurity such as boron (B) depending on a forming region of the gate structure 192.

Since the oxide layer may not be formed at the interface between the metal layer pattern 152 and the crystalline silicon layer pattern 162, the gate structure 192 may have a good electric characteristic.

FIGS. 2 to 6 are cross-sectional views that illustrate a method of forming a gate structure in accordance with some example embodiments.

Figure 2:
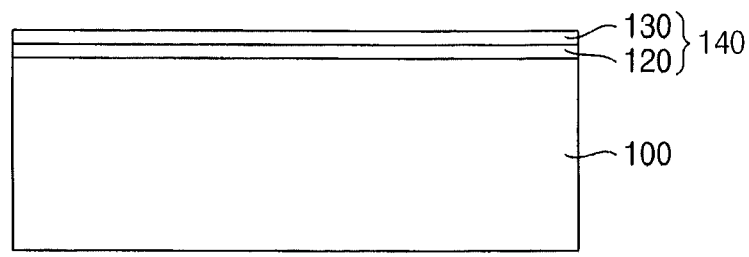

Referring to FIG. 2, a gate insulating layer 140 may be formed on the substrate 100.

The substrate 100 may include a silicon substrate, a germanium substrate, a silicon-germanium substrate, a silicon-on-insulator (SOI) substrate, etc.

The gate insulating layer 140 may be formed using a material having a high dielectricity. In example embodiments, the gate insulating layer 140 may be formed by integrating a low dielectric layer 120 and a high dielectric layer 130 one by one on the substrate 100.

The low dielectric layer 120 may be formed using silicon oxide, silicon oxynitride, etc. In example embodiments, the low dielectric layer 120 may be formed by executing a thermal oxidation process on the substrate 100 so as to include silicon oxide. Alternatively, the low dielectric layer 120 may be formed by further executing a plasma nitration process or a thermal nitration process after executing the thermal oxidation process so as to include silicon oxynitride.

The high dielectric layer 130 may be formed using a material having a high dielectricity, such as a metal oxide, a metal oxynitride, etc. through a CVD process, an atomic layer deposition (ALD) process, a sputtering process, etc. Examples of the material having a high dielectricity that may be used for forming the high dielectric layer 130 may include hafnium oxide, hafnium silicon oxide, zirconium oxide, zirconium silicon oxide, hafnium oxynitride, hafnium silicon oxynitride, zirconium oxynitride, zirconium silicon oxynitride, aluminum oxide, hafnium aluminum oxide, lanthanum oxide, hafnium lanthanum oxide, zirconium aluminum oxide, aluminum oxynitride, hafnium aluminum oxynitride, lanthanum oxynitride, hafnium lanthanum oxynitride, zirconium aluminum oxynitride, etc. These compounds may be used alone or in combination.

Figure 3:
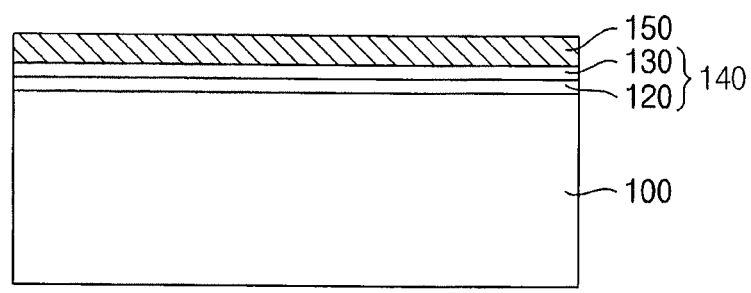

Referring to FIG. 3, a metal layer 150 may be formed on the gate insulating layer 140.

The metal layer 150 may be formed using a metal, a metal nitride, a metal silicide, etc. through a CVD process, an ALD process, a sputtering process, etc. Examples that may be used for forming the metal layer 150 may include molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride, titanium aluminum nitride, etc.

Since the metal layer 150 may be formed on the high dielectric layer 130, an amorphous silicon layer 160 to be formed on the metal layer 150 in a following process may not make a contact with the high dielectric layer 130. Accordingly, a generation of a Fermi level pinning phenomenon may be prevented.

Figure 4:
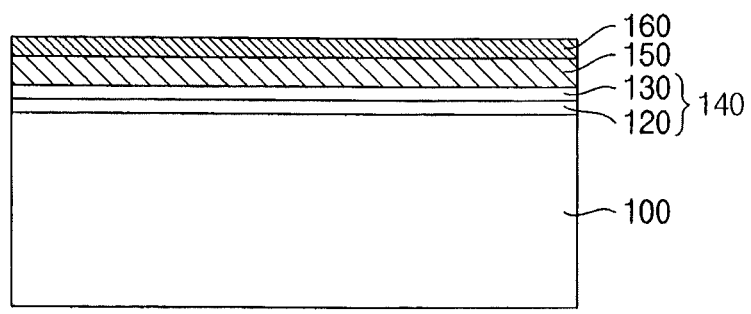

Referring to FIG. 4, an amorphous silicon layer 160 may be formed on the metal layer 150.

The amorphous silicon layer 160 may be formed by a PVD process, such as a sputtering process. In this case, an argon (Ar) gas may be used as a sputtering gas. In example embodiments, the sputtering process may be executed under a low pressure, for example, under a pressure of less than about $10^{-5}$ torr and more preferably, under a pressure of less than about $10^{-7}$ torr.

Accordingly, an oxide layer may not be formed at an interface between the amorphous silicon layer 160 and the underlying metal layer 150.

Figure 5:
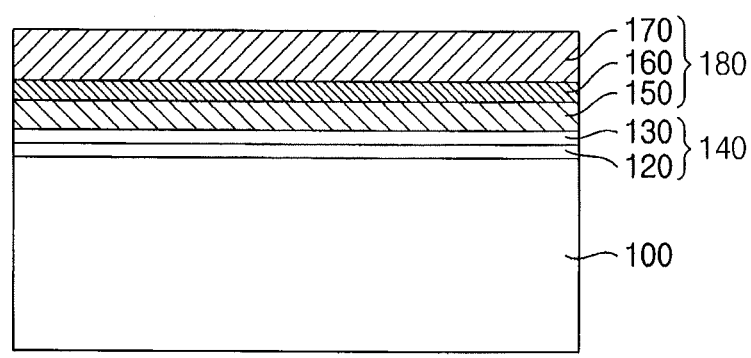

Referring to FIG. 5, an impurity doped polysilicon layer 170 may be formed on the amorphous silicon layer 160.

In example embodiments, the impurity doped polysilicon layer 170 may be formed using a silicon source gas and an impurity source gas and through a CVD process or an ALD process. In this case, the impurity doped polysilicon layer 170 may have a crystal structure of a column shape. When the gate structure is formed for forming an NMOS transistor, the impurity doped polysilicon layer 170 may be formed using an impurity source gas including an n-type impurity, such as phosphor (P). When the gate structure is formed for forming a PMOS transistor, the impurity doped polysilicon layer 170 may be formed using an impurity source gas including a p-type impurity such as boron (B).

Alternatively, the impurity doped polysilicon layer 170 may be formed by forming a polysilicon layer using a silicon source gas and through a CVD process or an ALD process, and then, doping impurities into the polysilicon layer by an ion implantation process. In this case, the ion implantation process with respect to the polysilicon layer may be performed with a lower energy when compared to the amorphous silicon layer 160.

The impurity doped polysilicon layer 170 may be formed to have a thickness greater than the amorphous silicon layer 160. In example embodiments, a total thickness of the amorphous silicon layer 160 and the impurity doped polysilicon layer 170 may be from about 400 angstroms to about 1,500 angstroms. The thickness of the impurity doped polysilicon layer 170 may be from about 50% to about 90% of the total thickness and more preferably may be from about 80% to about 90% of the total thickness.

A gate electrode 180 including the metal layer 150, the amorphous silicon layer 160 and the impurity doped polysilicon layer 170 integrated one by one on the gate insulating layer 140 may be formed.

Figure 6:
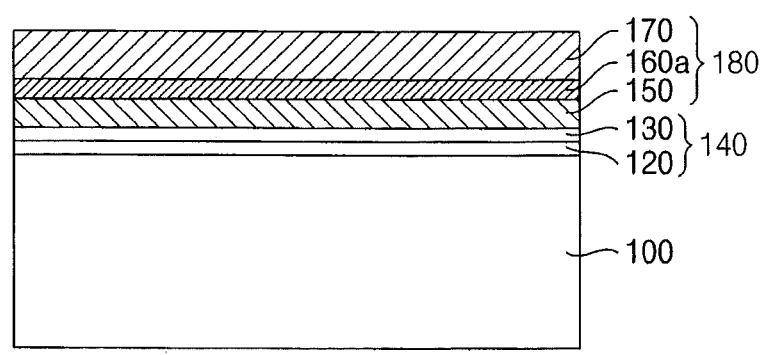

Referring to FIG. 6, an annealing process may be executed to activate the impurities doped into the impurity doped polysilicon layer 170.

In example embodiments, the annealing process may be executed at a temperature range from about 750° C. to about 1,150° C. and more preferably, at a temperature range from about 900° C. to about 1,100° C.

The amorphous silicon layer 160 may be crystallized to be transformed into a crystalline silicon layer 160a. In example embodiments, the crystalline silicon layer 160a may have a dendrite crystal structure grown in a lateral direction.

The impurities in the impurity doped polysilicon layer 170 may be efficiently activated even though the annealing process is performed at a lower temperature when compared to the amorphous silicon layer 160.

Referring to FIG. 1 again, the impurity doped polysilicon layer 170, the crystalline silicon layer 160a, the metal layer 150, the high dielectric layer 130, and the low dielectric layer 120 may be patterned one by one to form the gate structure 192 on the substrate 100.

The gate structure 192 may include a gate insulating layer pattern 142 and a gate electrode 182 integrated one by one on the substrate 100. The gate insulating layer pattern 142 may include the low dielectric layer pattern 122 and the high dielectric layer pattern 132. The gate electrode 182 may include the metal layer pattern 152, the crystalline silicon layer pattern 162 and the impurity doped polysilicon layer pattern 172.

In accordance with example embodiments, an amorphous silicon layer 160 may be formed on a metal layer 150 through a PVD process at a low pressure and so, the formation of an oxide layer at an interface between the metal layer 150 and the amorphous silicon layer 160 may be prevented. In addition, an impurity doped polysilicon layer 170 having a thickness larger than the amorphous silicon layer 160 may be formed and so a gate electrode 182 having a low overall resistance may be formed. Further, because diffusion of the impurities in the polysilicon layer may be faster than the amorphous silicon layer, the impurity doped polysilicon layer 170 may be easily formed with a low energy and at a low temperature.

FIGS. 7 to 11 are cross-sectional views that illustrate a method of manufacturing a semiconductor device including a gate structure in accordance with some example embodiments.

In the method of manufacturing the semiconductor device, the method of forming the gate structure illustrated in FIGS. 2 to 6 may be applied to a DRAM (dynamic random access memory) device. Accordingly, substantially the same or similar processes may be explained in brief.

Figure 7:
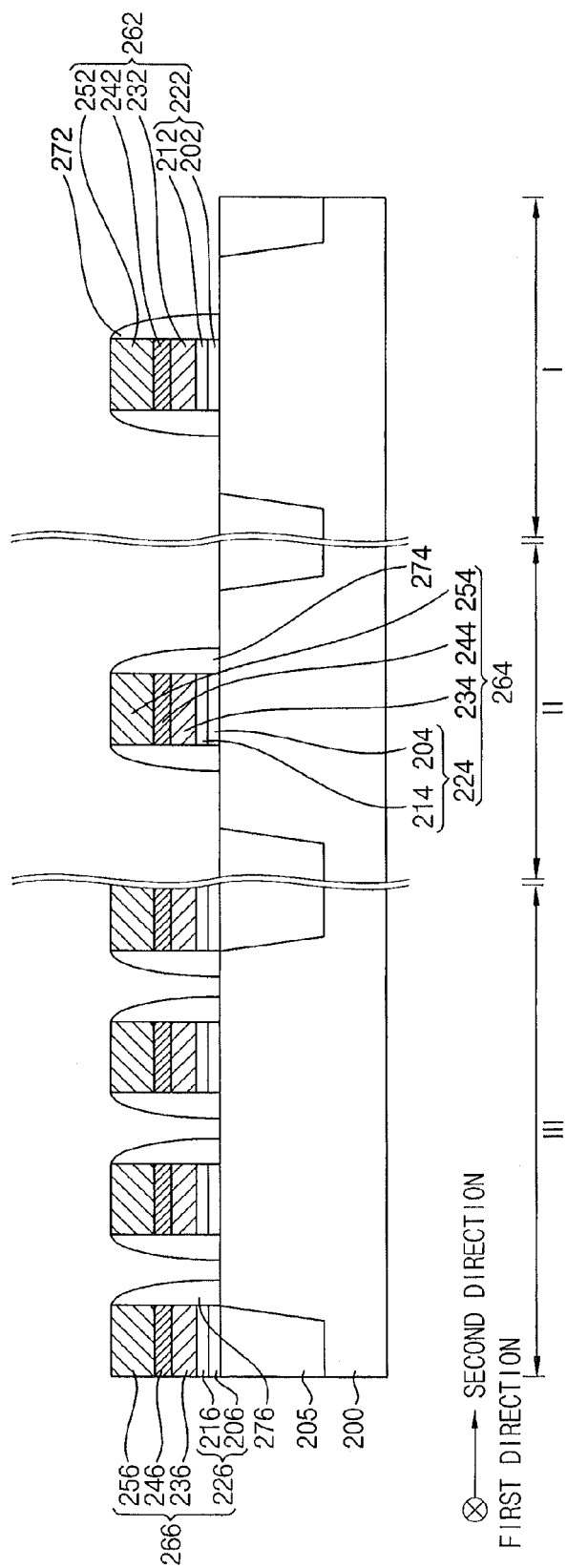

Referring to FIG. 7, a device isolation layer 205 may be formed at an upper portion of the substrate 200 and a first gate structure 262, a second gate structure 264 and a third gate structure 266 may be respectively formed in a first region (I), a second region (II), and a third region (III) of the substrate 200. In example embodiments, each of the gate structures 262, 264 and 266 may be extended in a first direction and a plurality of the gate structures 262, 264 and 266 may be formed in a second direction substantially perpendicular to the first direction. In example embodiments, the third region (III) may be a cell region, the first region (I) may be a PMOS region of a peripheral circuit region, and the second region (II) may be an NMOS region of the peripheral circuit region.

The first, second, and third gate structures 262, 264 and 266 may be formed by forming a gate insulating layer, a metal layer, an amorphous silicon layer, and an impurity doped polysilicon layer one by one on the substrate 200, and then executing a patterning process by means of photolithography. In example embodiments, an annealing process may be further performed after forming the impurity doped polysilicon layer to activate impurities included therein. In this case, the amorphous silicon layer may be crystallized to be transformed into a crystalline silicon layer.

The gate insulating layer may be formed using a material having a high dielectricity. In example embodiments, the gate insulating layer may be formed by forming a low dielectric layer and a high dielectric layer one by one on the substrate 200.

Accordingly, the first gate structure 262 may include a first gate insulating layer pattern 222, a first metal layer pattern 232, a first crystalline silicon layer pattern 242, and a first impurity doped polysilicon layer pattern 252 formed one by one in the first region (I) of the substrate 200, the second gate structure 264 may include a second gate insulating layer pattern 224, a second metal layer pattern 234, a second crystalline silicon layer pattern 244, and a second impurity doped polysilicon layer pattern 254 formed one by one in the second region (II) of the substrate 200, and the third gate structure 266 may include a third gate insulating layer pattern 226, a third metal layer pattern 236, a third crystalline silicon layer pattern 246, and a third impurity doped polysilicon layer pattern 256 formed one by one in the third region (III) of the substrate 200.

The first gate insulating layer pattern 222 may include a first low dielectric layer pattern 202 and a first high dielectric layer pattern 212 formed one by one, the second gate insulating layer pattern 224 may include a second low dielectric layer pattern 204 and a second high dielectric layer pattern 214 formed one by one, and the third gate insulating layer pattern 226 may include a third low dielectric layer pattern 206 and a third high dielectric layer pattern 216 formed one by one.

On each of the sidewall portions of the first, second and third gate structures 262, 264 and 266, a first spacer 272, a second spacer 274 and a third spacer 276 may be formed, respectively.

Figure 8:
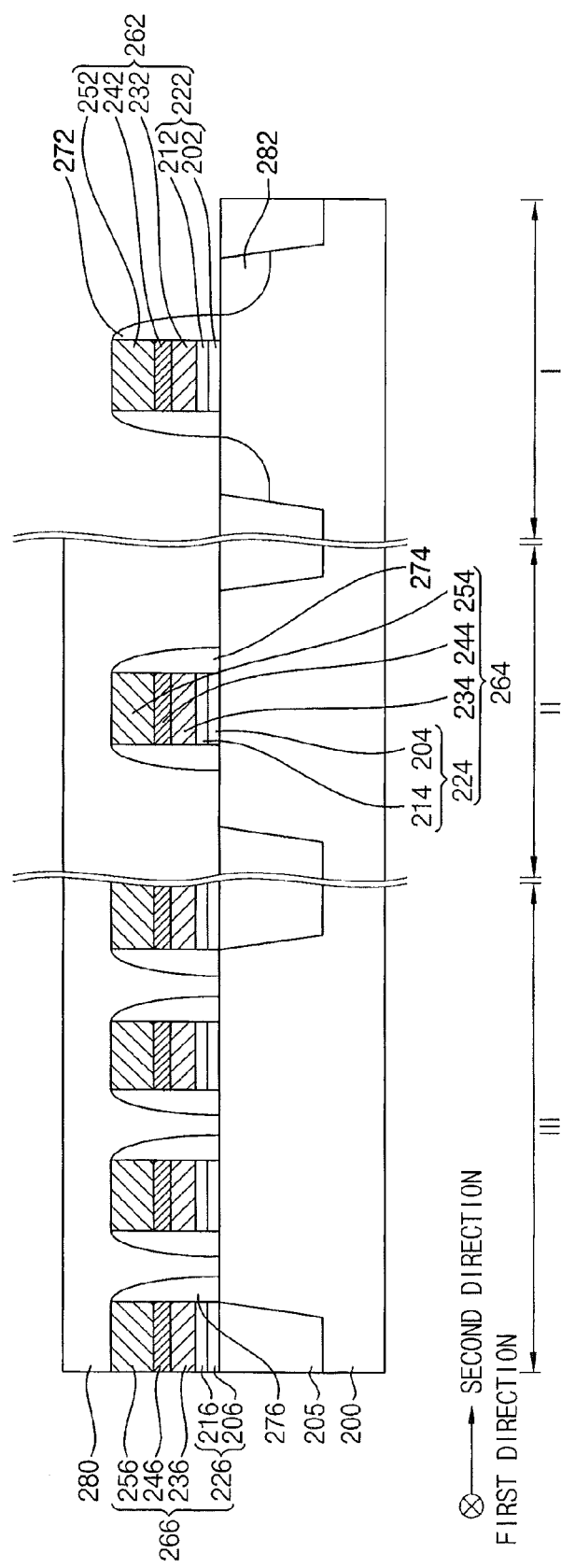

Referring to FIG. 8, a first mask 280 may be formed for covering the second region (II) and the third region (III) of the substrate 200. An ion implantation process using the first mask 280, the first gate structure 262, and the first spacer 272 as ion implantation masks may be performed to form a first impurity region 282 at an upper portion in the first region (I) of the substrate 200 adjacent to the first gate structure 262. In example embodiments, the first impurity region 282 may include p-type impurities. The first impurity region 282 may be source/drain regions of a PMOS transistor.

Then, the first mask 280 may be removed.

Figure 9:
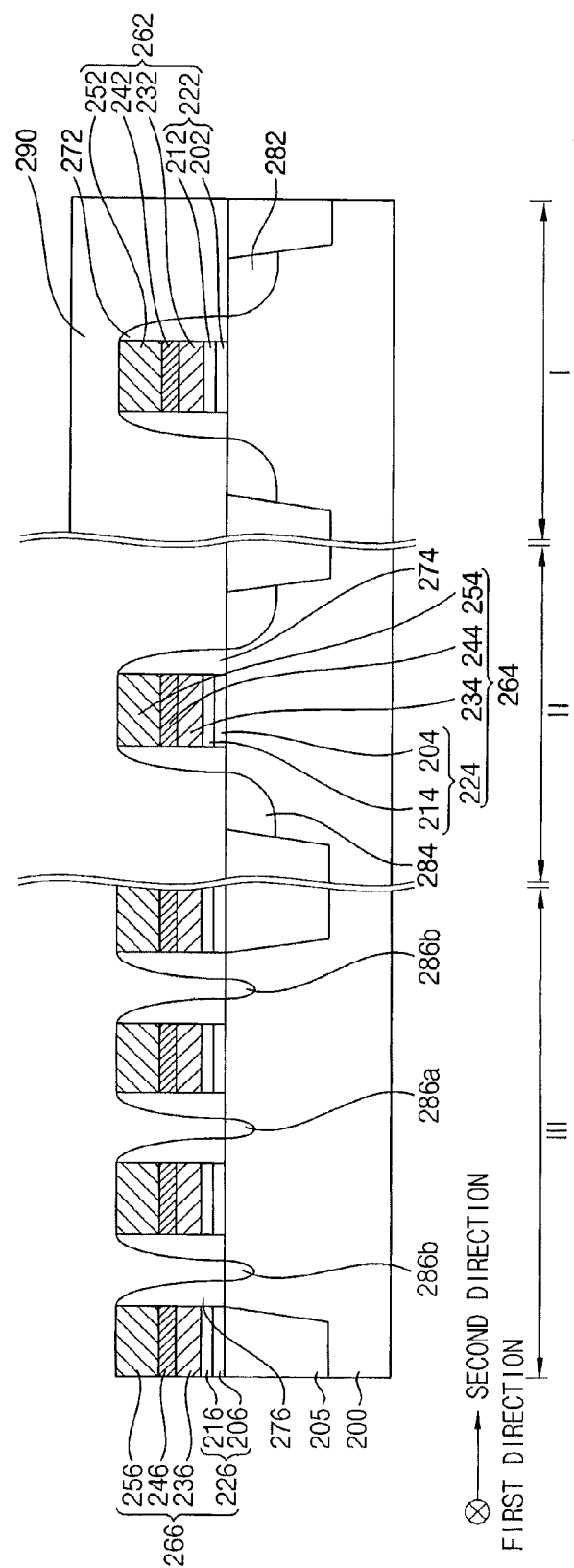

Referring to FIG. 9, a second mask 290 may be formed for covering the first region (I) of the substrate 200. An ion implantation process using the second mask 290, the second and third gate structures 264 and 266, and the second and third spacers 274 and 276 as ion implantation masks may be performed to form a second impurity region 284 at an upper portion in the second region (II) of the substrate 200 adjacent to the second gate structure 264 and to form a third impurity region 286a and a fourth impurity region 286b at an upper portion in the third region (III) of the substrate 200 adjacent to the third gate structure 266. The second, third and fourth impurity regions 284, 286a and 286b may be source/drain regions of an NMOS transistor.

Then, the second mask 290 may be removed.

Figure 10:
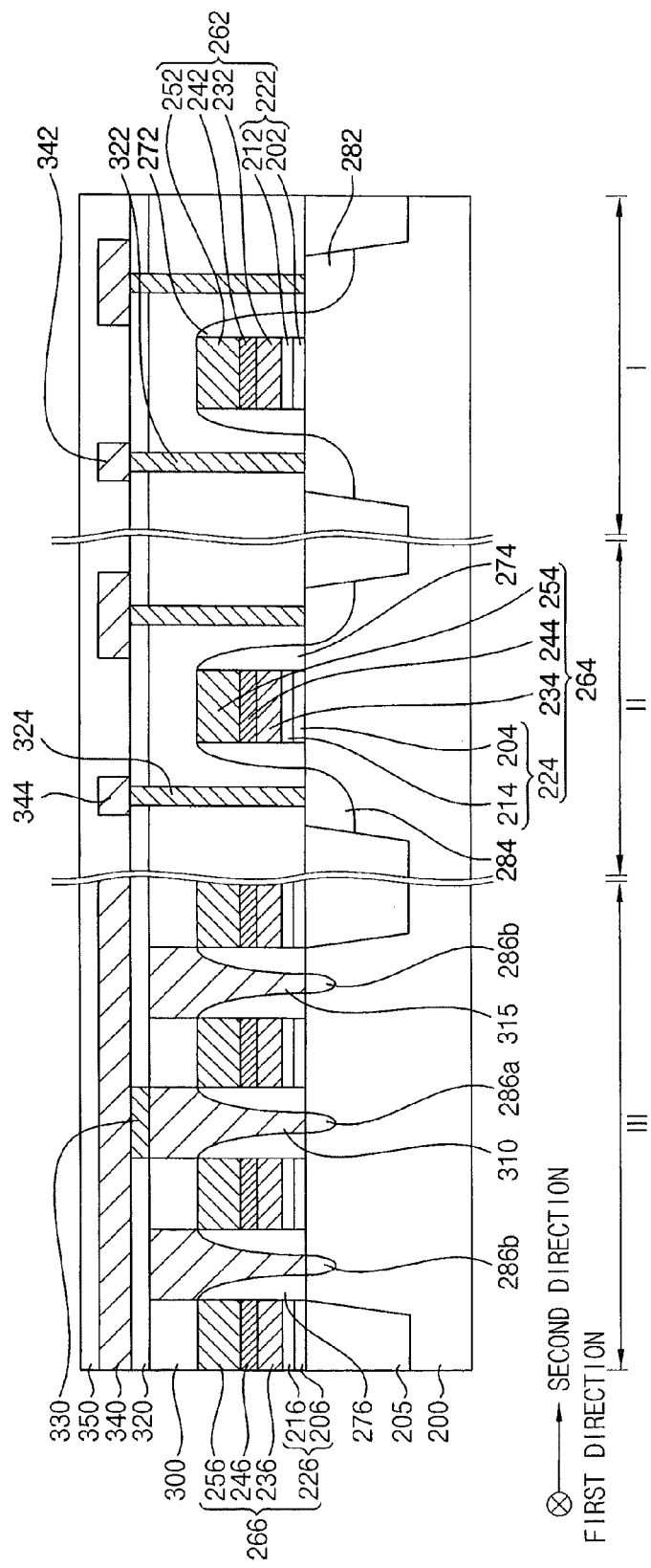

Referring to FIG. 10, a first insulating interlayer 300 covering the first to third gate structures 262, 264 and 266 and the first to third spacers 272, 274 and 276 may be formed on the substrate 200. The first insulating interlayer 300 may be formed using an oxide, such as a borophosphor silicate glass (BPSG), an un-doped silicate glass (USG), a spin-on-glass (SOG), etc.

First openings (not illustrated) penetrating the first insulating interlayer 300 may be formed to expose the third and fourth impurity regions 286a and 286b. A first conductive layer (not illustrated) filling up the first openings may be formed on the substrate 200 and the first insulating interlayer 300. The first conductive layer may be formed using doped polysilicon, a metal, a metal nitride, a metal silicide, etc. An upper portion of the first conductive layer may be planarized until an upper surface portion of the first insulating interlayer 300 may be exposed to form a first plug 310 and a second plug 315 electrically connected to the third and fourth impurity regions 286a and 286b, respectively.

On the first insulating interlayer 300 and the first and second plugs 310 and 315, a second insulating interlayer 320 may be formed. Second openings (not illustrated) penetrating the second insulating interlayer 320 may be formed to expose the first plug 310 and the first and second impurity regions 282 and 284. A second conductive layer (not illustrated) filling up the second openings may be formed on the substrate 200, the first plug 310, and the second insulating interlayer 320. The second conductive layer may be formed using doped polysilicon, a metal, a metal nitride, a metal silicide, etc. An upper portion of the second conductive layer may be planarized until an upper surface portion of the second insulating interlayer 320 may be exposed to form a bit line contact 330 electrically connected to the first plug 310 and to form a third plug 322 and a fourth plug 324 electrically connected to the first and second impurity regions 282 and 284, respectively.

A third conductive layer (not illustrated) making a contact with the bit line contact 330 and the third and fourth plugs 322 and 324 may be formed on the second insulating interlayer 320 and then a patterning process may be performed to form a bit line 340 making a direct electric connection with the bit line contact 330 and to form a first wiring 342 and a second wiring 344, respectively, making direct electrical connections with the third and fourth plugs 322 and 324. In example embodiments, the bit line 340 may be formed so as to extend in the second direction. The third conductive layer may be formed using doped polysilicon, a metal, a metal nitride, a metal silicide, etc.

A third insulating interlayer 350 covering the bit line 340 and the first and second wirings 342 and 344 may be formed on the second insulating interlayer 320.

Figure 11:
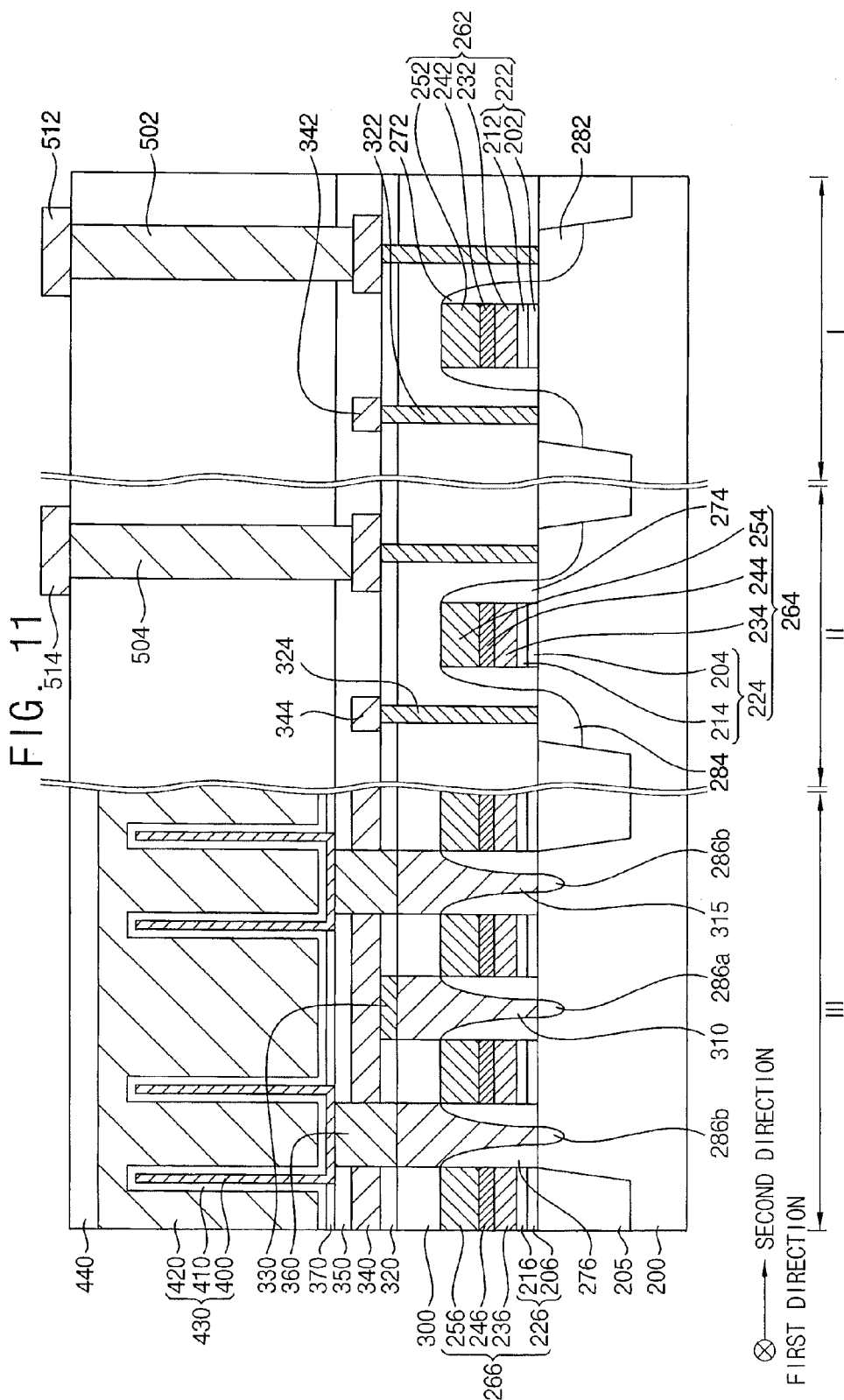

Referring to FIG. 11, third openings (not illustrated) penetrating the second and third insulating interlayers 320 and 350 may be formed to expose the second plugs 315. A fourth conductive layer (not illustrated) filling up the third openings may be formed on the second plugs 315 and the third insulating interlayer 350. The fourth conductive layer may be formed using doped polysilicon, a metal, a metal nitride, a metal silicide, etc. An upper portion of the fourth conductive layer may be planarized until an upper surface portion of the third insulating interlayer 350 may be exposed to form capacitor contacts 360 electrically connected to the second plugs 315.

An etch stopping layer 370 and a mold layer (not illustrated) may be formed on the capacitor contacts 360 and the third insulating interlayer 350. In example embodiments, the etch stopping layer 370 may be formed using silicon nitride and the mold layer may be formed using silicon oxide. Fourth openings (not illustrated) penetrating the mold layer and the etch stopping layer 370 may be formed to expose the capacitor contacts 360. A fifth conductive layer (not illustrated) may be formed on an inner wall portion of the fourth openings and on the mold layer. A sacrificial layer (not illustrated) filling up the fourth openings may be formed on the fifth conductive layer. The fifth conductive layer may be formed using doped polysilicon, a metal, a metal nitride, a metal silicide, etc. Upper portions of the sacrificial layer and the fifth conductive layer may be planarized until an upper surface portion of the mold layer may be exposed. The sacrificial layer may be removed. A lower electrode 400 may be formed on the inner wall portion of the fourth openings.

A dielectric layer 410 may be formed on the lower electrode 400 and the etch stopping layer 370. The dielectric layer 410 may be formed using silicon nitride or a material having a higher dielectricity than the silicon nitride. Examples of the material having a high dielectricity may include tantalum oxide, hafnium oxide, aluminum oxide, zirconium oxide, etc.

An upper electrode 420 may be formed on the dielectric layer 410. The upper electrode 420 may be formed using doped polysilicon, a metal, a metal nitride, a metal silicide, etc.

A capacitor 430 including the lower electrode 400, the dielectric layer 410 and the upper electrode 420 may be formed.

A fourth insulating interlayer 440 covering the capacitor 430 may be formed on the third insulating interlayer 350. Fifth openings (not illustrated) penetrating the fourth insulating interlayer 440 may be formed to expose the first and second wirings 342 and 344. A sixth conductive layer (not illustrated) filling up the fifth openings may be formed on the first and second wirings 342 and 344 and the fourth insulating interlayer 440. An upper portion of the sixth conductive layer may be planarized until an upper surface portion of the fourth insulating interlayer 440 may be exposed to form a fifth plug 502 and a sixth plug 504 electrically connected to the first and second wirings 342 and 344, respectively.

A third wiring 512 and a fourth wiring 514 electrically connected to the fifth and sixth plugs 502 and 504, respectively, may be formed. A passivation layer (not illustrated) passivating the third and fourth wirings 512 and 514 may be further formed to complete a semiconductor device.

Figure 12:
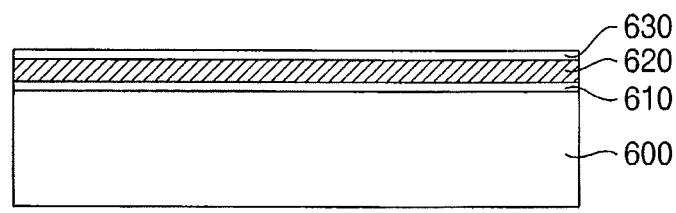
Figure 13:
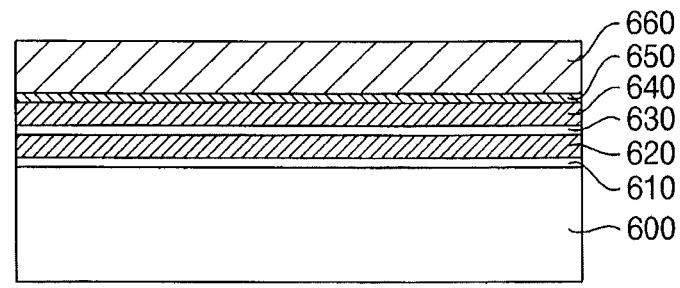
Figure 14:
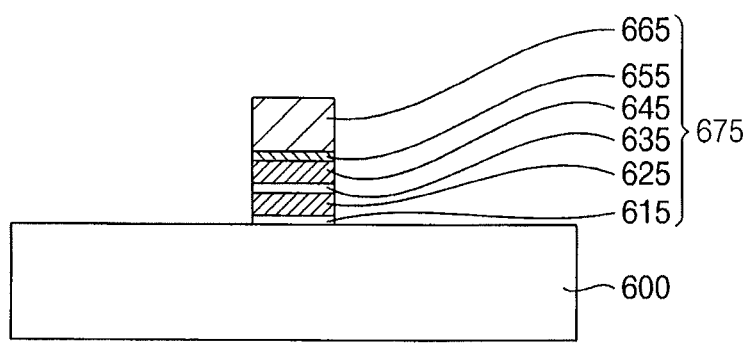

FIGS. 12 to 14 are cross-sectional views that illustrate a method of forming a gate structure in accordance with some other example embodiments.

Referring to FIG. 12, a tunnel insulating layer 610, a floating gate layer 620 and a dielectric layer 630 may be formed one by one on a substrate 600.

The tunnel insulating layer 610 may be formed by means of a CVD process, an ALD process, a PVD process such as a sputtering process, etc. using an oxide such as silicon oxide, an oxynitride such as silicon oxynitride, an impurity doped silicon oxide, a material having a low dielectricity, etc.

The floating gate layer 620 may be formed by means of an ALD process, a PVD process such as a sputtering process, a CVD process, etc. using an impurity doped polysilicon or a metal having a high work function, such as tungsten, titanium, cobalt, nickel, etc.

The dielectric layer 630 may be formed by depositing an oxide, a nitride, and an oxide one by one on the floating gate layer 620 by means of a CVD process, an ALD process, or a PVD process, such as a sputtering process. Alternatively, the dielectric layer 630 may be formed using a metal having a high dielectricity, such as hafnium oxide, titanium oxide, tantalum oxide, zirconium oxide, aluminum oxide, etc.

Referring to FIG. 13, a control gate layer (not illustrated) may be formed on the dielectric layer 630. The control gate layer may be formed through performing substantially the same or similar processes explained referring to FIGS. 2 to 6. That is, processes may be performed to form a metal layer 150, an amorphous silicon layer 160, and an impurity doped polysilicon layer 170. Then, an annealing process may be performed to transform the amorphous silicon layer 160 into a crystalline silicon layer 160*a*, as illustrated in FIGS. 2 to 6. In these example embodiments, similar processes may be performed to form a metal layer 640, a crystalline silicon layer 650, and an impurity doped polysilicon layer 660 integrated one by one on the dielectric layer 630 to manufacture the control gate layer.

Referring to FIG. 14, the impurity doped polysilicon layer 660, the crystalline silicon layer 650, the metal layer 640, the dielectric layer 630, the floating gate layer 620, and the tunnel insulating layer 610 may be partially etched through photolithography using a photoresist pattern (not illustrated) as a mask, to form a floating gate 625, a dielectric layer pattern 635, a metal layer pattern 645, a crystalline silicon layer pattern 655, and an impurity doped polysilicon layer pattern 665 integrated one by one on the tunnel insulating layer pattern 615.

Alternatively, the etching process may be performed using a hard mask (not illustrated) formed using silicon nitride. Spacers may be formed using silicon nitride on sidewall portions of the tunnel insulating layer pattern 615, the floating gate 625, the dielectric layer pattern 635, the metal layer pattern 645, the crystalline silicon layer pattern 655, and the impurity doped polysilicon layer pattern 665, even though not illustrated.

A gate structure 675 in accordance with another example embodiment may be formed.

FIGS. 15 to 18 are cross-sectional views that illustrate a method of manufacturing a semiconductor device including a gate structure for a floating gate-type memory device in accordance with some other example embodiments.

Figure 15:
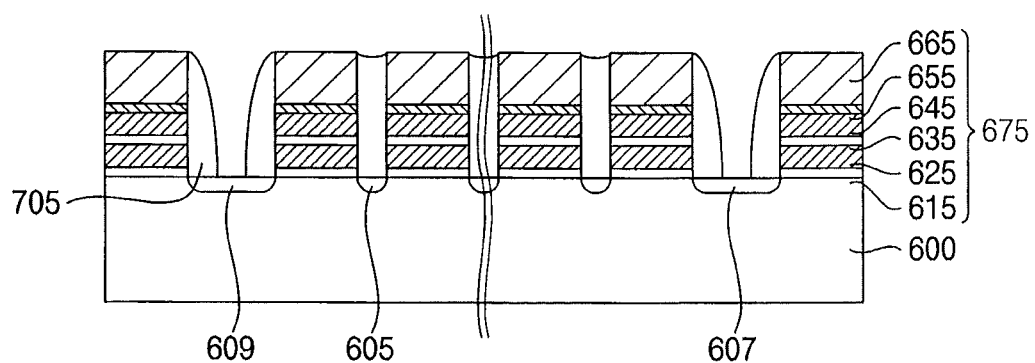

Referring to FIG. 15, a gate structure 675 including a tunnel insulating layer pattern 615, a floating gate 625, a dielectric layer pattern 635, a metal layer pattern 645, a crystalline silicon layer pattern 655 and an impurity doped polysilicon layer pattern 665 may be formed on a substrate 600. The gate structure 675 may extend in a second direction and a plurality of the gate structures 675 may be formed along a first direction substantially perpendicular to the second direction. Because the forming method of the gate structure 675 has been described above, a detailed explanation on the forming of the gate structure 675 will be omitted.

Here, the formed gate structure 675 may also be used as a string selecting line (SSL) and a ground selecting line (GSL) as well as a plurality of word lines in the flash memory device.

First, second, and third impurity regions 605, 607 and 609 including n-type or p-type impurities may be formed. The first impurity region 605 may be formed at an upper portion of the substrate 600 between word lines, the SSL and the GSL formed in one string. The second and third impurity regions 607 and 609 may be formed at an upper portion of the substrate 600 between strings. After forming the first to third impurity regions 605, 607, and 609, a spacer 705 may be further formed on a sidewall portion of the gate structure 675. The spacer 705 may include a nitride, such as silicon nitride.

Figure 16:
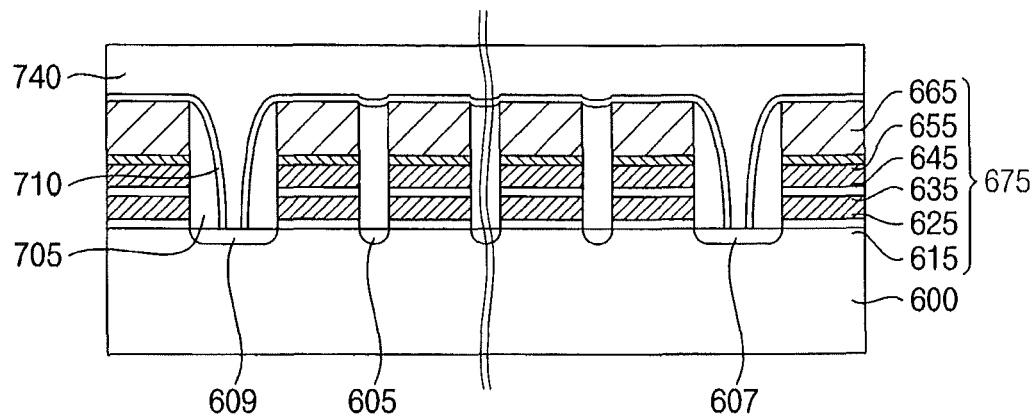

Referring to FIG. 16, a passivation layer 710 may be formed on the gate structure 675 and the spacer 705. The passivation layer 710 may include a nitride, such as silicon nitride.

After forming the passivation layer 710, a first insulating interlayer 740 covering the gate structure 675 and the passivation layer 710 may be formed on the substrate 600. The first insulating interlayer 740 may be formed using an oxide such as BPSG, USG, SOG, etc.

Figure 17:
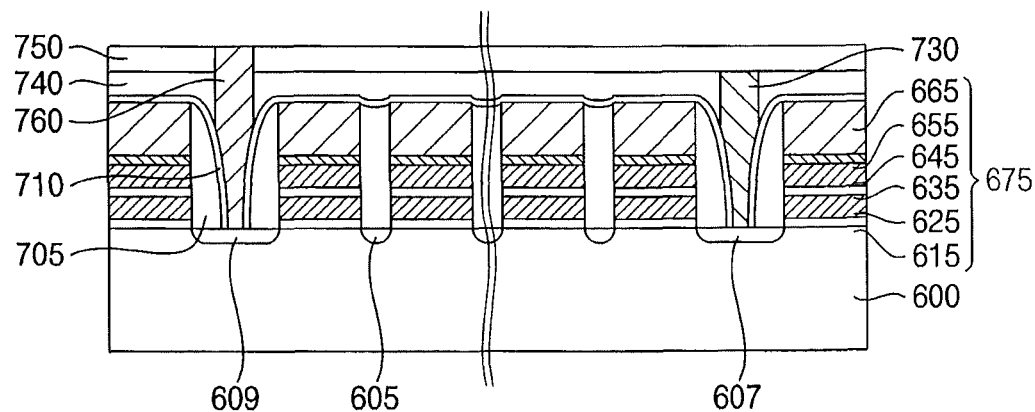

Referring to FIG. 17, a GSL 730 penetrating the first insulating interlayer 740 may be formed on the second impurity region 607. The GSL 730 may be formed using doped polysilicon, a metal, or a metal silicide.

A second insulating layer 750 may be formed on the first insulating interlayer 740 and the GSL 730. The second insulating interlayer may be formed using an oxide, such as BPSG, USG, SOG, etc.

After forming the second insulating interlayer 750, a bit line contact 760 penetrating the first and second insulating interlayers 740 and 750 may be formed on the third impurity region 609. The bit line contact 760 may include a metal, doped polysilicon, etc.

Figure 18:
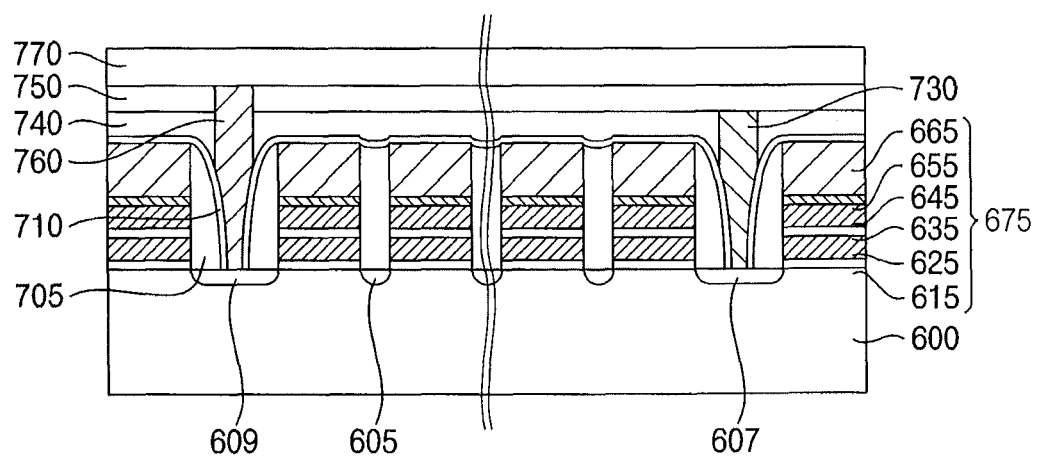

Referring to FIG. 18, after forming the bit line contact 760, a bit line 770 making a contact with the bit line contact 760 may be formed on the second insulating interlayer 750. The bit line 770 may extend in the first direction and may include a metal, doped polysilicon, etc. Through forming the bit line 770, the floating gate-type flash memory device may be manufactured.

As described above, an amorphous silicon layer may be formed by a physical vapor deposition process under a low pressure on a metal layer formed on a gate insulating layer in example embodiments. Accordingly, formation of an oxide layer at an interface between the metal layer and the amorphous silicon layer may be prevented. In addition, because a polysilicon layer may be formed to a thickness greater than the amorphous silicon layer in a following process, an effective implantation and diffusion of impurities into the polysilicon layer with a low energy level at a low temperature may be accomplished.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

That which is claimed:

1. A method of forming a gate structure comprising:
   forming a gate insulating layer on a substrate;

forming a metal layer on the gate insulating layer;
forming an amorphous silicon layer on the metal layer by a physical vapor deposition (PVD) process; and
forming an impurity doped polysilicon layer on the amorphous silicon layer.

2. The method of forming a gate structure of claim 1, wherein the PVD process is performed under a pressure lower than $10^{-5}$ torr.

3. The method of forming a gate structure of claim 1, further comprising:
annealing the gate structure after forming the impurity doped polysilicon layer.

4. The method of forming a gate structure of claim 3, wherein the annealing is performed at a temperature range from about 750° C. to about 1,150° C.

5. The method of forming a gate structure of claim 3, further comprising:
transforming the amorphous silicon layer into a crystalline silicon layer responsive to the annealing.

6. The method of forming a gate structure of claim 1, wherein forming the impurity doped polysilicon layer comprises:
forming a polysilicon layer on the amorphous silicon layer through a chemical vapor deposition (CVD) process or an atomic layer deposition (ALD) process; and
doping impurities into the polysilicon layer using an ion implantation process.

7. The method of forming a gate structure of claim 1, wherein forming the gate insulating layer comprises:
forming a low dielectric layer on the substrate; and
forming a high dielectric layer on the low dielectric layer.

8. The method of forming a gate structure of claim 7, wherein the high dielectric layer comprises at least one oxide selected from the group consisting of hafnium oxide, zirconium oxide, tantalum oxide, aluminum oxide, lanthanum oxide, hafnium silicon oxide, zirconium silicon oxide and tantalum silicon oxide.

9. The method of forming a gate structure of claim 1, wherein the metal layer comprises at least one compound selected from the group consisting of molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride and titanium aluminum nitride.

10. The method of forming a gate structure of claim 1, wherein a thickness of the impurity doped polysilicon layer is about 50% to about 90% of a total thickness of the amorphous silicon layer and the impurity doped polysilicon layer.

11. A method of manufacturing a semiconductor device comprising:
forming a gate insulating layer on a substrate;
forming a metal layer on the gate insulating layer;
forming an amorphous silicon layer on the metal layer through a physical vapor deposition (PVD) process;
forming an impurity doped polysilicon layer on the amorphous silicon layer;
annealing the semiconductor device to activate impurities included in the impurity doped polysilicon layer and to crystallize the amorphous silicon layer to form a crystalline silicon layer; and
patterning the impurity doped polysilicon layer, the crystalline silicon layer, the metal layer, and the gate insulating layer one by one to form a gate structure including a gate insulating layer pattern, a metal layer pattern, a crystalline silicon layer pattern and an impurity doped polysilicon layer pattern.

12. The method of manufacturing a semiconductor device of claim 11, wherein the PVD process is performed under a pressure lower than $10^{-5}$ torr.

13. The method of manufacturing a semiconductor device of claim 11, wherein forming the impurity doped polysilicon layer comprises:
forming a polysilicon layer on the amorphous silicon layer through a chemical vapor deposition (CVD) process or an atomic layer deposition (ALD) process; and
doping impurities into the polysilicon layer using an ion implantation process.

14. The method of manufacturing a semiconductor device of claim 1, wherein forming the gate insulating layer comprises:
forming a low dielectric layer on the substrate; and
forming a high dielectric layer on the low dielectric layer.

15. The method of manufacturing a semiconductor device of claim 14, wherein the high dielectric layer comprises at least one oxide selected from the group consisting of hafnium oxide, zirconium oxide, tantalum oxide, aluminum oxide, lanthanum oxide, hafnium silicon oxide, zirconium silicon oxide and tantalum silicon oxide.

16. The method of manufacturing a semiconductor device of claim 11, wherein the metal layer comprises at least one compound selected from the group consisting of molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride and titanium aluminum nitride.

17. The method of manufacturing a semiconductor device of claim 11, wherein a thickness of the impurity doped polysilicon layer is about 50% to about 90% of a total thickness of the amorphous silicon layer and the impurity doped polysilicon layer.

18. A method of forming a gate structure, comprising:
forming a gate insulating layer on a substrate;
forming a metal layer on the gate insulating layer;
forming a crystalline silicon layer on the metal layer; and
forming an impurity doped polysilicon layer on the crystalline silicon layer;
wherein the crystalline silicon layer has a larger grain size than the impurity doped polysilicon layer.

19. The method of forming a gate structure of claim 18, wherein forming the crystalline silicon layer comprises:
forming an amorphous silicon layer on the metal layer by a physical vapor deposition (PVD) process; and
annealing the gate structure after forming the impurity doped polysilicon layer to transform the amorphous silicon layer into the crystalline silicon layer.

20. The method of forming a gate structure of claim 18, wherein a thickness of the impurity doped polysilicon layer is about 50% to about 90% of a total thickness of the crystalline silicon layer and the impurity doped polysilicon layer.

* * * * *